US012587135B2

(12) United States Patent
Nohara et al.

(10) Patent No.: US 12,587,135 B2
(45) Date of Patent: Mar. 24, 2026

(54) OSCILLATION CIRCUIT AND ELECTRONIC DEVICE

(71) Applicants: Inter-University Research Institute Corporation High Energy Accelerator Research Organization, Tsukuba (JP); Piezo Studio Inc., Sendai (JP)

(72) Inventors: Masaya Nohara, Tsukuba (JP); Takehito Ishii, Sendai (JP); Noritoshi Kimura, Sendai (JP)

(73) Assignees: Inter-University Research Institute Corporation High Energy Accelerator Research Organization, Ibaraki (JP); Piezo Studio Inc., Miyagi (JP)

( * ) Notice: Subject to any disclaimer, the term of this patent is extended or adjusted under 35 U.S.C. 154(b) by 0 days.

(21) Appl. No.: 18/943,436

(22) Filed: Nov. 11, 2024

(65) Prior Publication Data

US 2025/0158570 A1 May 15, 2025

(30) Foreign Application Priority Data

Nov. 13, 2023 (JP) ................................. 2023-193013

(51) Int. Cl.
H03B 5/06 (2006.01)
H03B 5/36 (2006.01)

(52) U.S. Cl.
CPC ................. H03B 5/06 (2013.01); H03B 5/36 (2013.01); H03B 5/364 (2013.01);
(Continued)

(58) Field of Classification Search
CPC ... H03B 5/06; H03B 5/30; H03B 5/32; H03B 5/36; H03B 5/364; H03B 5/366;
(Continued)

(56) References Cited

U.S. PATENT DOCUMENTS 6,556,094 B2 * 4/2003 Hasegawa ............ H03K 3/0307
331/173
8,026,771 B2 * 9/2011 Kanai ....................... H03L 5/00
331/172

(Continued)

FOREIGN PATENT DOCUMENTS

JP 2006-060687 A 3/2006
JP 2007-116487 A 5/2007

(Continued)

OTHER PUBLICATIONS

Notice of Refusal received for Japanese Patent Application No. 2023-193013, mailed on Jan. 7, 2025, 6 pages (3 pages of English Translation and 3 pages of Original Document).

*Primary Examiner* — Levi Gannon
(74) *Attorney, Agent, or Firm* — WOMBLE BOND DICKINSON (US) LLP

(57) ABSTRACT

The oscillation circuit 1 comprises: an oscillator X1; a first capacitance CF having one end connected to the oscillator X1; a second capacitance CO having one end connected to the other end of the first capacitance CF; an output terminal Vo connected to a connection point N2 of the first capacitance CF and the second capacitance CO; an amplifier circuit A1 connected between a node between the oscillator X1 and the first capacitance CF and a connection point N2 of the first capacitance CF and the second capacitance CO to form an oscillation loop together with the first capacitance CF; a differential amplifier circuit A2 arranged on the oscillation loop; and a feedback path 3 configured to feed a part of an output on the output terminal Vo to the differential amplifier circuit A2.

8 Claims, 7 Drawing Sheets

(52) U.S. Cl.
CPC ................ *H03B 2200/0008* (2013.01); *H03B 2200/0012* (2013.01); *H03B 2200/0082* (2013.01); *H03B 2200/0094* (2013.01)

(58) Field of Classification Search
CPC ............ H03B 5/368; H03B 2200/0008; H03B 2200/0012; H03B 2200/0082; H03B 2200/0094
See application file for complete search history.

(56) References Cited

U.S. PATENT DOCUMENTS

| | | | | |
|---|---|---|---|---|
| 9,209,747 | B1 * | 12/2015 | Sinha | ...................... H03B 5/06 |
| 9,413,341 | B1 | 8/2016 | Ho et al. | |
| 10,581,378 | B1 * | 3/2020 | Verhoef | .............. H03K 3/0307 |
| 2007/0090889 | A1 | 4/2007 | Nomura | |
| 2011/0037527 | A1 | 2/2011 | Shrivastava et al. | |
| 2011/0090016 | A1 | 4/2011 | Getta et al. | |
| 2018/0309391 | A1 * | 10/2018 | Endou | .................. B06B 1/0269 |
| 2019/0103837 | A1 | 4/2019 | Madala et al. | |
| 2022/0085760 | A1 * | 3/2022 | Watanabe | ............ G01D 5/2405 |
| 2023/0291355 | A1 | 9/2023 | Nohara et al. | |

FOREIGN PATENT DOCUMENTS

| | | | |
|---|---|---|---|
| JP | 2014-146984 | A | 8/2014 |
| JP | 6967248 | B1 | 11/2021 |
| JP | 2022-021830 | A | 2/2022 |
| JP | 2022-131314 | A | 9/2022 |

* cited by examiner

OSCILLATION
FREQUENCY (HZ)

OSCILLATION
FREQUENCY (HZ)

FROM SOURCE
FOLLOWER OUTPUT

FROM SOURCE
FOLLOWER OUTPUT

OSCILLATION CIRCUIT AND ELECTRONIC DEVICE

TECHNICAL FIELD

The present invention relates to an oscillation circuit using an oscillator, and an electronic device.

BACKGROUND ART

In recent years, there has been a demand for longer battery life in mobile phones and Internet-of-Things (IoT) devices. With those devices, various things connect to the Internet. For this reason, it has become an important technical issue to reduce the power consumption of electronic circuits and electronic components used in such devices.

In reference oscillation circuits used in small IoT tele-communications devices, inverter-based Pierce circuits using oscillators have been widely used. As shown in FIG. 11, for example, the Pierce circuit 100 includes an IC 200 and an oscillator X1. The IC 200 includes a resistor R1, an inverter A3 arranged in parallel with the oscillator X1, a fixed capacitance C1a and C1b connected to one end and the other end of each of the resistor R1 and the inverter A3, and an active element A4. The oscillator X1 is arranged between the fixed capacitances C1a and C1b to be arranged in parallel to the resistor R1. Such an inverter-based Pierce circuit 100 has a simple and easy-to-use circuit configuration. However, there is a problem in that the power consumption is large due to steady current flow.

As a solution to the above problem, Patent Document 1 proposes a configuration in which a MOS transistor is used as a complementary device in a source-follower-based Colpitts oscillation circuit. The source-follower-based Colpitts oscillation circuit disclosed in Patent Document 1 has succeeded in reducing the current consumption in the steady state (oscillating state) by about one tenth as compared to conventional Pearce circuits.

However, the source-follower-based Colpitts oscillation circuit has a problem that the oscillation start-up is slower than that of conventional Pearce circuits.

For the problem of such slow oscillation start-up, in Patent Document 2, for example, discloses an oscillation circuit 400 including an inverter-based Pierce circuit 500 and a Colpitts oscillation circuit 600 as shown in FIG. 12. The oscillation circuit 400 is configured to switch between the two oscillation circuits by means of switches SW3 and SW4, to use the inverter-based Pierce circuit 500 as a start-up circuit at the time of oscillation start-up, and to use the Colpitts oscillation circuit 600 as a steady state circuit at the time of steady state oscillation.

However, in this oscillation circuit 400, there may be discontinuities in the output voltage amplitude and oscillation frequency when switching between the Pierce circuit 500 and the Colpitts oscillation circuit 600.

Another problem with the source-follower-based Colpitts oscillation circuit is that oscillation is not carried out when the oscillation frequency is high because a large negative resistance cannot be obtained so that the oscillation condition is not satisfied.

CITATION LIST

Patent Document 1: JP 6967248 B
Patent Document 2: JP 2022-131314 A

SUMMARY OF THE INVENTION

The present invention has been made to solve the above problems and aims to provide an oscillation circuit that facilitates high-speed start-up and high-frequency oscillation.

An oscillation circuit according to an embodiment of the present invention includes an oscillator, a first capacitance having one end connected to the oscillator, a second capacitance having one end connected to the other end of the first capacitance, an output terminal connected to a node between the first capacitance and the second capacitance, an amplifier circuit connected between the oscillator and the first capacitance and the node between the first capacitance and the second capacitance to form an oscillation loop together with the first capacitance, a differential amplifier circuit arranged on the oscillation loop, and a feedback path configured to feed a part of an output on the output terminal back to the differential amplifier circuit.

Moreover, the electronic device according to an embodiment of the present invention comprises the oscillation circuit described above.

In accordance with the present invention, it is possible to provide an oscillation circuit that facilitates fast start-up and high-frequency oscillation.

BRIEF DESCRIPTION OF THE DRAWINGS

FIG. 4 shows the frequency characteristics of the negative resistance in the oscillation circuit according to the first embodiment of the present invention when the differential amplifier circuit is ON.

FIG. 5 shows the frequency characteristics of the negative resistance in the oscillation circuit according to the first embodiment of the present invention when the differential amplifier circuit is ON.

DETAILED DESCRIPTION OF THE INVENTION

First Embodiment

Figure 1:
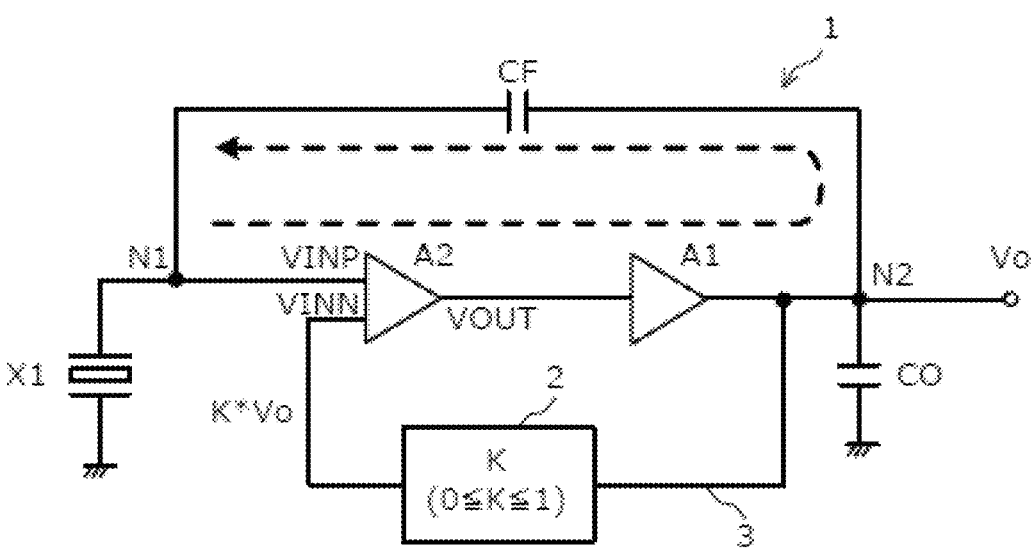
FIG. 1 shows a configuration example of an oscillation circuit according to a first embodiment of the present invention.

FIG. 1 shows a configuration example of an oscillation circuit according to the first embodiment of the present invention. The oscillation circuit 1 according to the present embodiment includes: an oscillator X1; a first capacitance CF having one end connected to the oscillator X1; a second capacitance CO having one end connected to the other end of the first capacitance CF; an output terminal Vo connected to a connection point N2 of the first capacitance CF and the second capacitance CO; an amplifier circuit A1 connected between the connection point N1 of the oscillator X1 and the first capacitance CF and the connection point N2 of the first capacitance CF and the second capacitance CO to form an oscillation loop together with the first capacitance CF; a differential amplifier circuit A2 arranged on the oscillation loop; and a feedback path 3 configured to feed a part of the output on the output terminal Vo back to the differential amplifier circuit A2. In the oscillation circuit 1 according to the present embodiment, a feedback amount adjusting circuit 2 configured to adjust the feedback amount to the differential amplifier circuit A2 is also installed on the feedback path 3.

In the oscillation circuit 1 according to the present embodiment, the oscillator X1, the first capacitance CF, the second capacitance CO, and the amplifier circuit A1 constitute a Colpitts oscillation circuit. Here, the amplifier circuit A1 can be a complementary source follower. For example, the amplifier circuit A1 may be constituted by a source follower in which the NMOS transistor and the PMOS transistor are cascaded.

The differential amplifier A2 includes a first input terminal VINP, a second input terminal VINN, and a differential output terminal VOUT. In the oscillation circuit 1 according to the present embodiment, the first input terminal VINP of the differential amplifier circuit A2 is connected to a node between the oscillator X1 and the first capacitance CF, and the differential output terminal VOUT of the differential amplifier circuit is connected to the input terminal of the amplifier circuit A1. The second input terminal VINN of the differential amplifier circuit A2 is connected to the feedback path 3. As shown in FIG. 1, in the oscillation circuit 1 according to the present embodiment, the differential amplifier circuit A2 is arranged on a preceding stage of the amplifier circuit A1 in the oscillation loop including the amplifier A1 and the first capacitance CF of the Colpitts oscillation circuit. However, the position where the differential amplifier circuit A2 is arranged is not limited to the preceding stage of the amplifier circuit A1 if the phase condition retained by the Colpitts oscillation circuit can be retained. For example, the differential amplifier circuit A2 may be arranged on a subsequent stage of the amplifier circuit A1, or may be arranged on a preceding stage or a subsequent stage of the oscillation capacitance CF in the oscillation loop.

Figure 2A:
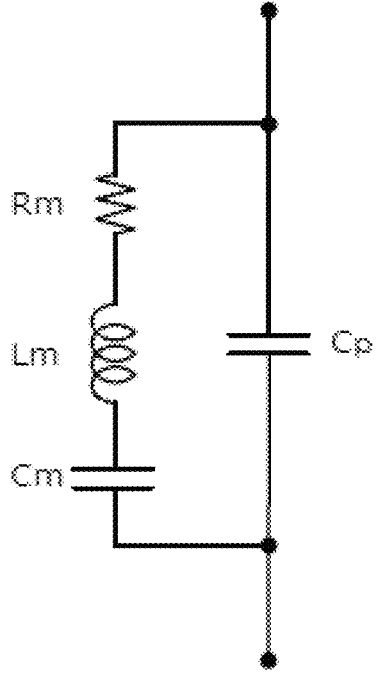
FIG. 2A shows an example of an equivalent circuit of an oscillator.
Figure 2B:
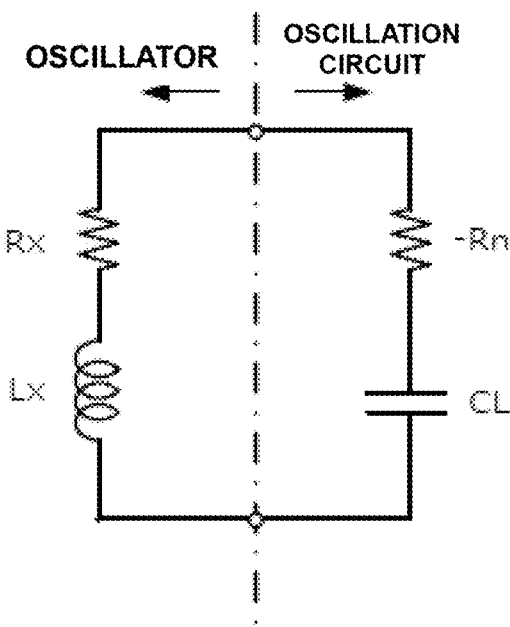
FIG. 2B shows a common equivalent circuit of the oscillation circuit.

FIG. 2A shows an equivalent circuit of the oscillator X1. The equivalent circuit of the oscillator X1 can be indicated by an equivalent series resistor Rm, an equivalent series capacitance Cm, and an equivalent series inductance Lm, which are connected in series, and an equivalent parallel capacitance Cp, which is connected in parallel with these elements. FIG. 2B shows a common equivalent circuit of an oscillation circuit using a piezoelectric oscillator. In FIG. 2B, the left side of the dash-dot line shows an equivalent circuit of the oscillator, and the right side of the dash-dot line shows an equivalent circuit of the oscillation circuit. Rx is an equivalent series resistance under load on the oscillator side, and the load capacitance CL is an equivalent series capacitance on the oscillator circuit side when viewed from the oscillator side. –Rn is negative resistance of the oscillation circuit.

In order to oscillate, it is necessary to generate negative resistance Rn on the oscillation circuit side, which cancels the series equivalent resistance Rx on the oscillator side. The oscillation start-up time can be shortened by increasing the value of the negative resistance Rn.

In the oscillation circuit 1 according to the present embodiment, one of the input terminals, that is, the first input terminal VINP, of the differential amplifier circuit A2 arranged in series in the oscillation loop of the Colpitts oscillation circuit is directly connected to the connection point N1 of the oscillation loop, and a part of the output of the Colpitts oscillation circuit, that is, a part of the output of the amplifier circuit A1, is fed back to the second input terminal VINN of the differential amplifier circuit A2 via the feedback path 3.

In the path of the first input terminal NINP, the input/output phase difference of the differential amplifier circuit A2 is zero because the differential amplifier circuit A2 needs to retain the phase condition retained by the original oscillation loop including the first capacitance CF and the amplifier circuit A1 of the Colpitts oscillation circuit. In the path of the second input terminal VINN, a phase rotation corresponding to the feedback amount can be applied in the oscillation loop of the oscillation circuit 1 by adjusting the feedback amount with the feedback amount adjusting circuit 2. As a result, it is possible to change the frequency characteristics of the negative resistance.

Figure 3:
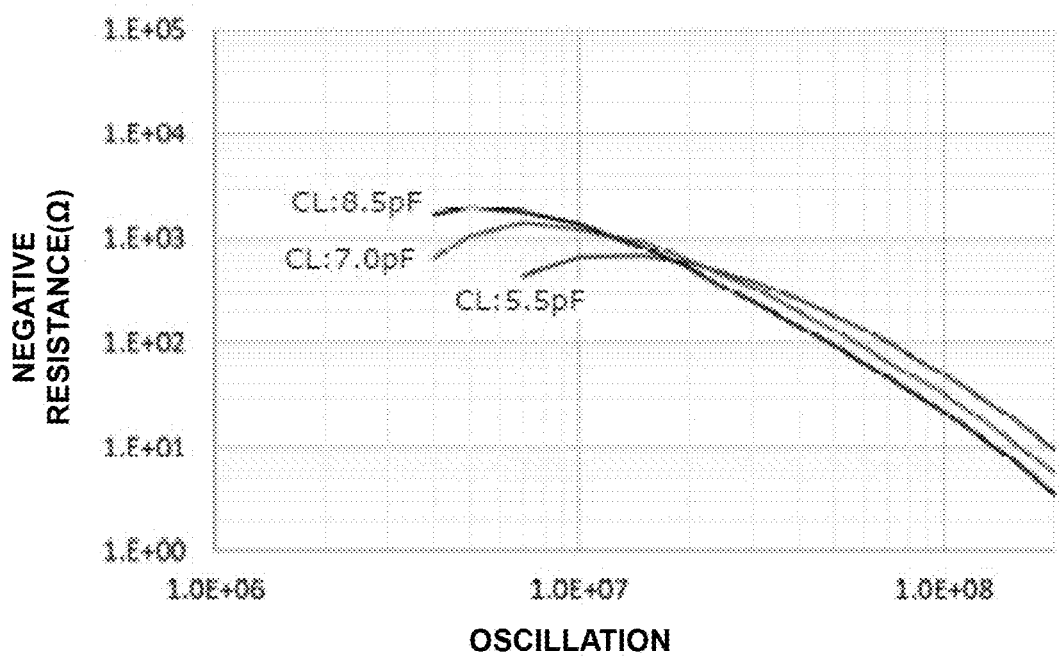
FIG. 3 shows frequency characteristics of negative resistance of a Colpitts oscillation circuit in the oscillation circuit according to the first embodiment of the present invention when the differential amplifier circuit is OFF and only the Colpitts oscillation circuit is actively operated.
Figure 4:
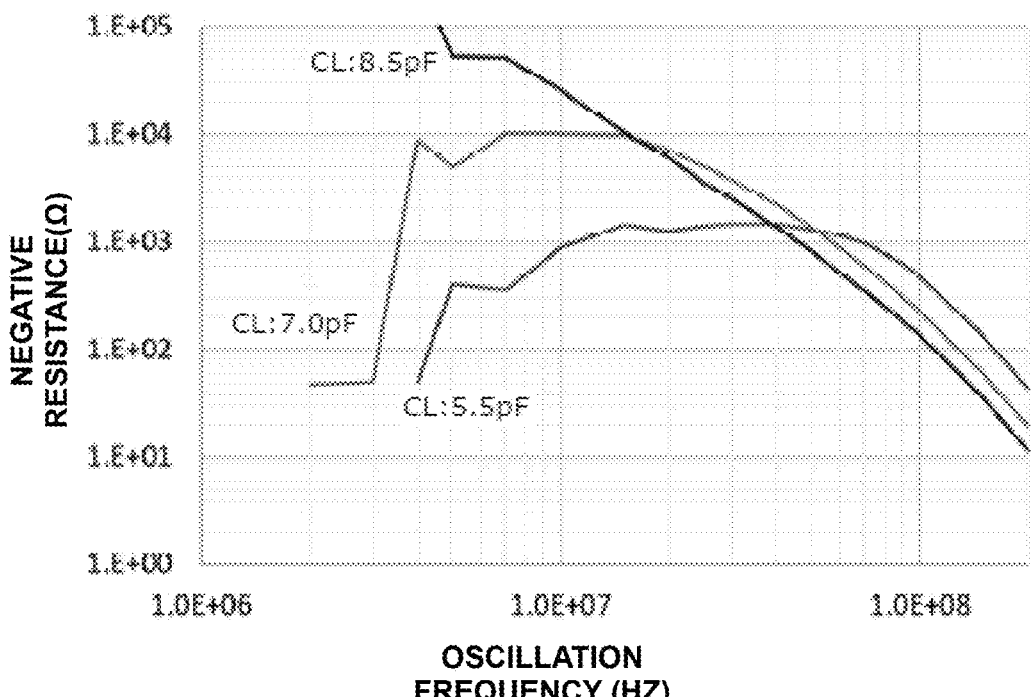
Figure 5:
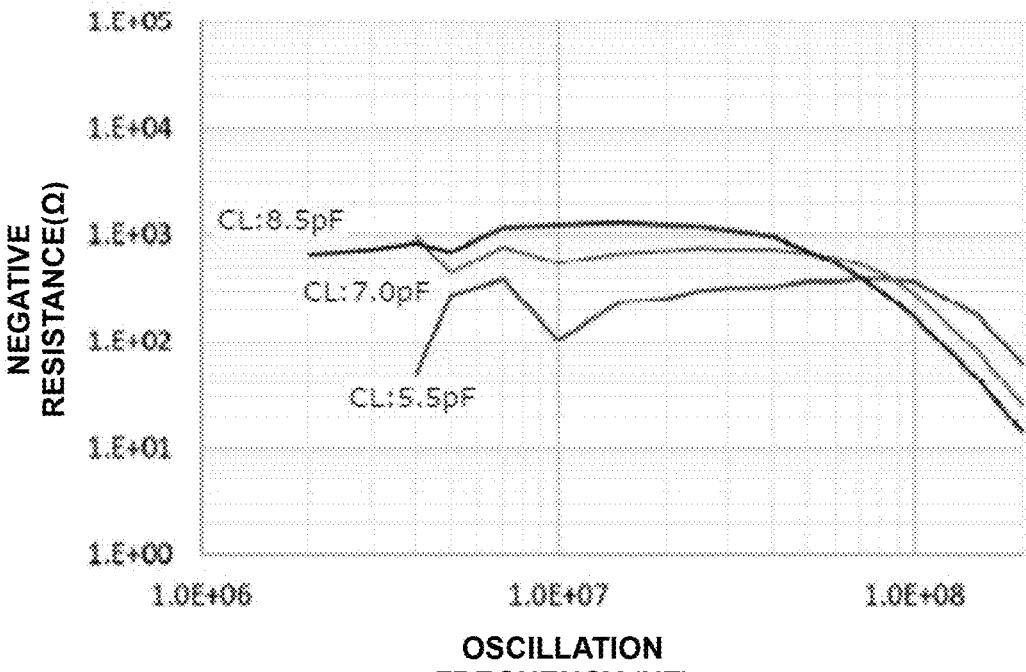

FIGS. 3-5 show graphs illustrating the frequency characteristics of the negative resistance when the equivalent capacitance CL on the oscillator circuit side as viewed from the oscillator X1 is changed under conditions wherein ON/OFF of the differential amplifier circuit A2 and when the differential amplifier circuit A2 is ON, the feedback amount, are different. FIG. 3 shows the frequency characteristics of the negative resistance when the differential amplifier circuit A2 is OFF, and FIGS. 4 and 5 show the frequency characteristics of the negative resistance when the differential amplifier circuit A2 is ON.

In all of FIGS. 3-5, it can be seen that the smaller the equivalent capacitance CL, the easier it is to obtain a large negative resistance on the high frequency side.

Comparing the negative resistance when the differential amplifier circuit A2 is OFF and only the Colpitts oscillation circuit is actively operated (FIG. 3) with the negative resistance when the differential amplifier circuit A2 is ON (FIG. 4 and FIG. 5), it can be seen that by causing the differential amplifier circuit A2 to be ON, the negative resistance of about ten times as that of the case where only the Colpitts oscillation circuit is actively operated can be obtained at 50 MHz. In addition, negative resistance of 200Ω was obtained at 100 MHz, and it became possible to oscillate with the Colpitts oscillation circuit also at that frequency.

FIG. 4 shows the frequency characteristics when the differential amplifier circuit A2 is ON and the feedback amount is small (K=11/16), and FIG. 5 shows the frequency characteristics when the differential amplifier circuit A2 is ON and the feedback amount is large (K=14/16). From the comparison between FIG. 4 and FIG. 5, it can be said that the lower the feedback amount, the more adaptive frequency response to lower frequencies.

Therefore, increasing the feedback amount under conditions with reduced load capacitance is sufficient for facilitating high-frequency oscillation.

Figure 6A:
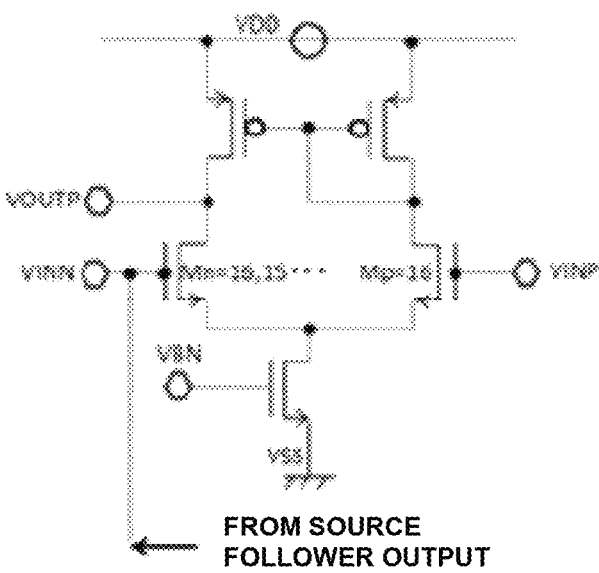
FIG. 6A shows a configuration example of a feedback amount adjusting circuit in the oscillation circuit according to the first embodiment of the present invention.
Figure 6B:
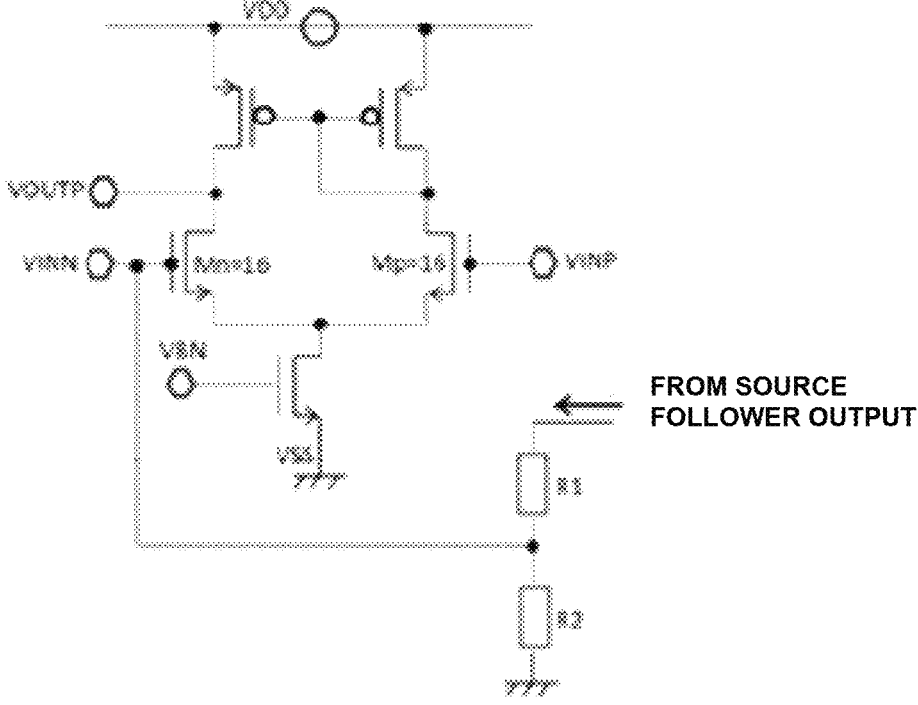
FIG. 6B shows another configuration example of a feedback amount adjusting circuit in the oscillation circuit according to the first embodiment of the present invention.

FIGS. 6A and 6B show configuration examples of the feedback amount adjusting circuit in the oscillation circuit according to the present invention. In FIG. 6A, a feedback signal is input from the terminal VINN of the differential amplifier circuit. Differential pair transistors (transistor pairs having VINN and VINP as input terminals) of the differential amplifier circuit are constituted by, for example, 16 parallel transistors, and the number of actively-operating transistors on the VINN side is reduced from 16 when reducing the feedback amount. Specifically, by switching the transistor gate from the signal side to the GND side with, for example, a switch, and causing the transistor to be OFF, the number of actively-operating transistors can be reduced to adjust the feedback amount.

In FIG. 6A, the number of actively-operating transistors is controlled to adjust the feedback amount. However, in FIG. 6B, the feedback amount is controlled by the corresponding voltage of the resistor arranged before the transistor without controlling the number of operating transistors. It is possible to control the feedback amount by changing the resistor to a capacitor on the basis of the principle of keeping the corresponding voltage the same.

According to the oscillation circuit of the present embodiment, it is possible to facilitate fast start-up and high frequency oscillation. Meanwhile, by connecting the differential amplifier circuit to the oscillation loop of the oscillation circuit and feeding a part of the output of the amplifier circuit A1 back to the second input terminal of the differential amplifier circuit A2, it is possible to increase the negative resistance of the oscillation circuit or change the frequency characteristics of the negative resistance. Therefore, it is possible to achieve a higher degree of design freedom while easily realizing high-speed start-up and high frequency oscillation.

Figure 11:
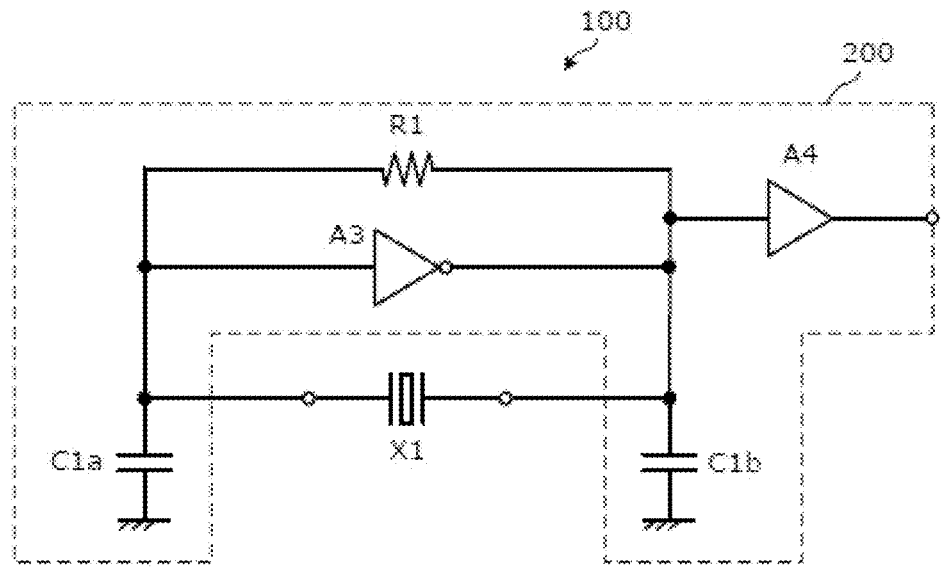
FIG. 11 shows a configuration example of an oscillation circuit using a conventional Pierce circuit.

The frequency characteristics of the negative resistance can be changed by changing the oscillation capacitance in the conventional oscillation circuit of FIG. 11 also. However, it is possible to achieve an oscillation circuit with a high degree of design freedom compared to conventional configurations in accordance with the oscillation circuit of the present embodiment.

Second Embodiment

Next, an oscillation circuit according to the second embodiment of the present invention will be described with reference to FIGS. 7-10.

The above-described oscillation circuit according to the first embodiment of the present invention is beneficial when negative resistance is insufficient for maintaining steady-state oscillation with only the amplifier circuit A1 since the differential amplifier circuit A2 is actively operated not only at the time of oscillation start-up but also at the time of steady-state oscillation. However, there is a problem that the oscillation noise characteristics deteriorate and the current consumption increases by continuing to cause the differential amplifier circuit A2 to be actively operated even at the time of steady-state oscillation. Meanwhile, the oscillation circuit according to the second embodiment of the present invention is configured to switch between a first mode of oscillation operation in which the differential amplifier circuit A2 is actively operated at the oscillation start-up, and a second mode of oscillation operation in which the differential amplifier circuit A2 is not actively operated at the steady-state oscillation.

Figure 7:
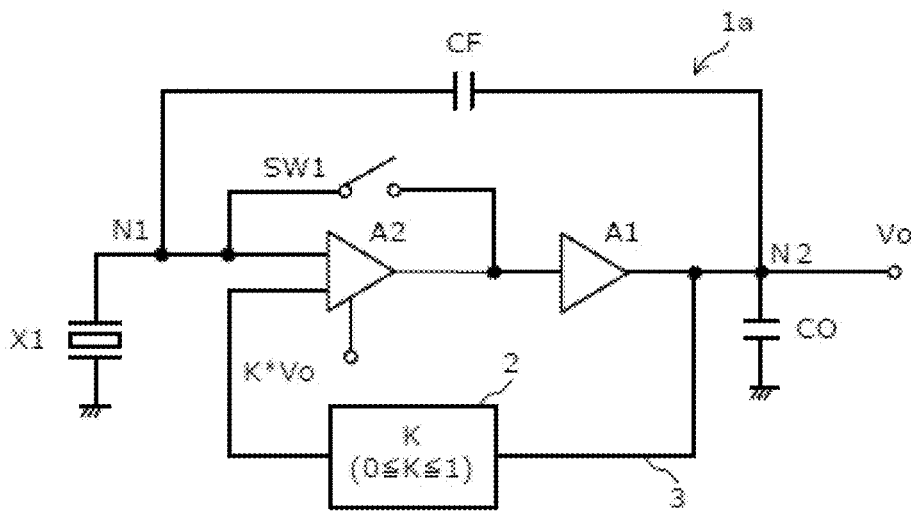
FIG. 7 shows an example of a configuration of an oscillation circuit according to a second embodiment of the present invention.

FIG. 7 shows a configuration example of the oscillation circuit according to the second embodiment of the present invention. In the oscillation circuit 1 according to the first embodiment of the present invention, the differential amplifier circuit A2 is actively operated not only at the time of oscillation start-up but also at the time of steady-state oscillation. Meanwhile, the oscillation circuit 1a according to the second embodiment of the present invention is configured to cause the differential amplifier circuit A2 to be actively operated only at the time of oscillation start-up and to cause the differential amplifier circuit A2 to be not actively operated at the time of steady-state oscillation.

Specifically, as shown in FIG. 7, the oscillation circuit 1a includes a switch SW1 which is arranged in parallel with the differential amplifier circuit A2 and which selectively connects the first input terminal VINP of the differential amplifier A2 and the differential output terminal VOUT with each other. The oscillation circuit 1a is configured to switch between the first mode of oscillation operation in which the differential amplifier circuit A2 is actively operated at the time of oscillation start-up, and the second mode of oscillation operation in which the differential amplifier circuit A2 is not actively operated at the time of steady-state oscillation.

By switching between the first mode of oscillation operation and the second mode of oscillation operation and causing the differential amplifier circuit A2 to be not actively operated at the time of steady-state oscillation in this way, it is possible to avoid problems such as deterioration of the oscillation noise characteristics and increase in the current consumption caused by continuing to cause the differential amplifier circuit A2 to be actively operated even at the time of steady-state oscillation.

Meanwhile, in terms of switching modes of oscillation operation, the oscillation circuit 400 (see FIG. 12) disclosed in Patent Document 2 is also configured to switch two oscillation circuits, that is, the inverter-based Pierce circuit 500 and the Colpitts oscillation circuit 600, by the switches SW3 and SW4 in order to achieve both fast start-up and low power consumption, and to utilize only the inverter-based Pierce circuit 500 at the oscillation start-up and cause only the Colpitts oscillation circuit 600 to be actively operated at the steady-state oscillation.

Figure 12:
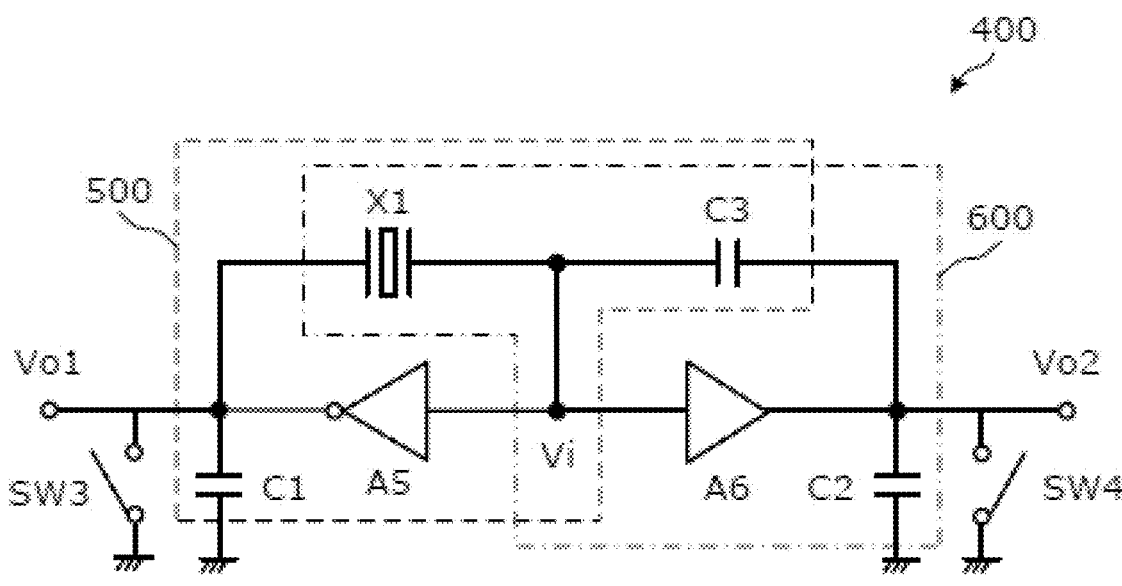
FIG. 12 shows a configuration example of an oscillation circuit that switches a conventional Pierce circuit and a Colpitts oscillation circuit.

However, in the configuration of the oscillation circuit 400 disclosed in Patent Document 2 as shown in FIG. 12, there is a problem that discontinuities are likely to be present in the output voltage amplitude and oscillation frequency when switching the two oscillation circuits 500 and 600.

The discontinuities in the output voltage amplitude are created because saturation is likely to occur at the stage where the oscillation amplitude of the inverter-based Pierce oscillation circuit 500 that oscillates at the start-up is small. More specifically, the discontinuities in the oscillation frequency are created because, among the three oscillation capacitances in the oscillation circuit shown in FIG. 12, only one oscillation capacitance C3 is commonly used at the time of both the oscillation start-up and steady-state oscillation. It is not impossible to adjust the discontinuities of the oscillation frequency, but since it takes a lot of man-hours, the product cannot be manufactured at low cost.

Meanwhile, in the oscillation circuit 1a according to the second embodiment of the present invention, the circuit that is actively operated at the time of oscillation start-up of the oscillation circuit is changed from the inverter-based Pierce circuit to the differential amplifier circuit A2 having a function of feedback amount control, as shown in FIG. 7. Moreover, the oscillation circuit 1a includes: a switch SW1 for connecting the input and the output of the differential amplifier circuit A2 so that the differential amplifier circuit A2 is detoured at the time of steady-state oscillation; and an ON/OFF input terminal for causing the differential amplifier circuit A2 to be actively operated at the time of oscillation start-up and causing the differential amplifier circuit A2 to be not actively operated at the time of steady-state oscillation.

The oscillation circuit 1a according to the second embodiment of the present invention switches between the first mode of oscillation operation in which the differential amplifier circuit A2 is actively operated at the oscillation start-up, and the second mode of oscillation operation in which the differential amplifier circuit A2 is not actively operated. By using the differential amplifier circuit A2 only at the time of oscillation start-up in this way, it is possible to solve the problem of the oscillation circuit 1 according to the first embodiment of the present invention, that is, the problem of deterioration of oscillation noise characteristics and increase in current consumption caused by continuing to cause the differential amplifier circuit A2 to be actively operated even at the time of steady-state oscillation.

Figure 8:
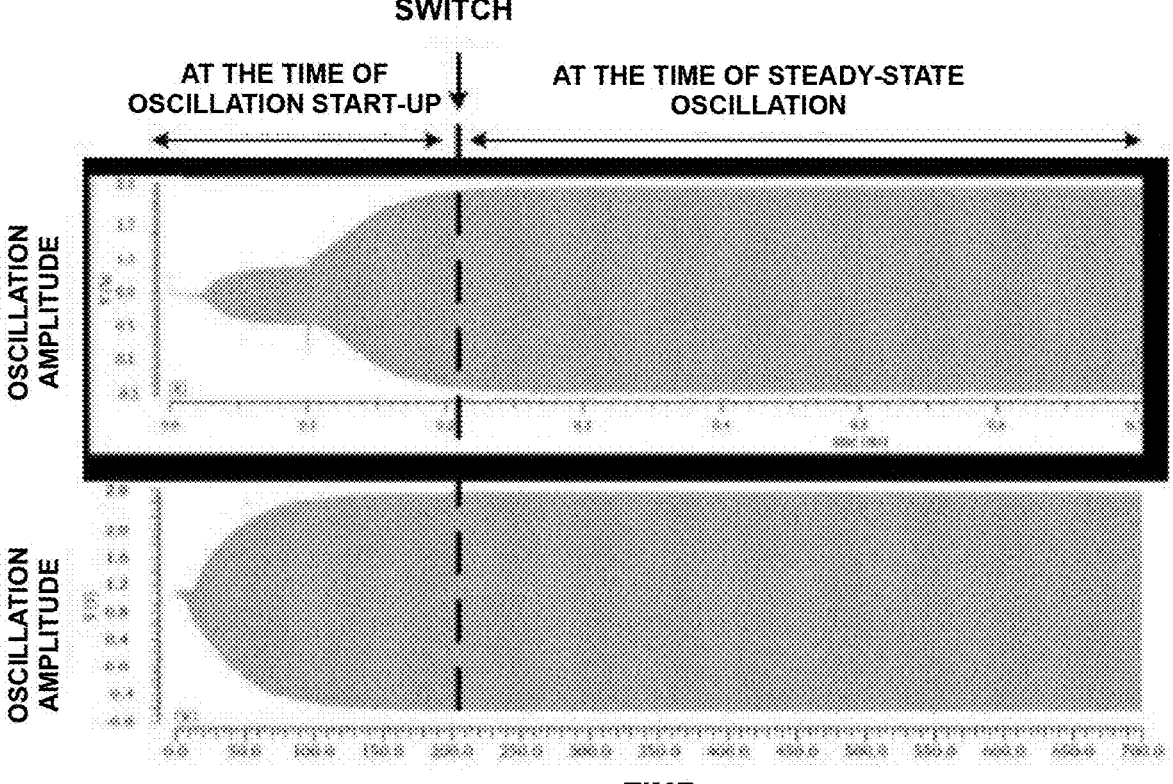
FIG. 8 shows an example of oscillation amplitude start-up characteristics of the oscillation circuit according to the second embodiment of the present invention.

FIG. 8 shows a comparison between an example of oscillation amplitude start-up characteristics of the oscillation circuit shown in FIG. 12 and an example of oscillation amplitude start-up characteristics of the oscillation circuit 1a according to the present embodiment. As shown in the upper part of FIG. 8, the inverter-based Pierce oscillation circuit used at the start-up of the oscillation circuit shown in FIG. 12 tends to saturate on a situation where the oscillation amplitude is small, resulting in oscillation growth forming amplitude steps from the start-up to the steady-state oscillation.

In the oscillation circuit 1a according to the present embodiment, it is possible to solve the discontinuities in the output voltage amplitude, which constitutes a problem in the oscillation circuit of FIG. 12, as shown in the lower part of FIG. 8, by using the differential amplifier circuit A2 at the time of oscillation start-up.

Regarding the timing of transitioning to the Colpitts oscillation circuit from the time of oscillation start-up to the time of steady-state oscillation, that is, the timing of switching the switch SW1 and causing the differential amplifier A2 to be OFF, it is desirable to switch the switch SW1 when the oscillation amplitude at the time of oscillation start-up has stabilized to some extent in order to smooth the transition of the oscillation frequency. For example, the switching timing of the switch may be the time when the oscillation amplitude reaches 70-95% of the final convergence amplitude.

Moreover, by using the differential amplifier circuit A2 at the time of oscillation start-up, it is possible to eliminate discontinuities in the output voltage amplitude and oscillation frequency. Such discontinuities have been problems in the oscillation circuit shown in FIG. 12.

In the oscillation circuit 1a according to the present embodiment, a single source-follower-based Colpitts oscillation circuit is used both at the oscillation start-up and at the steady-state oscillation, and a differential amplifier circuit A2 arranged on the oscillation loop is configured to be actively operated only at the oscillation start-up. With such a configuration, the oscillation capacitance used does not change before and after the switching, and therefore it is possible to reduce the discontinuities in the oscillation frequency before and after the switching.

Next, the switch SW1 in the oscillation circuit 1a according to the present embodiment will be described furthermore with reference to FIGS. 9 and 10.

The switch SW1 can be achieved by, for example, a switching circuit constituted by a switching transistor or an FET. The trigger signal for switching the switch SW1 may be output from, for example, a circuit that monitors the oscillation amplitude of the oscillation circuit 1a. For example, as shown in FIG. 9, an oscillation amplitude detection circuit 4 is provided in a subsequent stage of the oscillation circuit 1a, and the oscillation amplitude detection circuit 4 outputs a control signal when the oscillation amplitude of the oscillation signal Vo of the Colpitts oscillation circuit reaches a predetermined reference value. Accordingly, the control signal output from the oscillation amplitude detection circuit 4 can be used as a trigger signal when switching of the switch SW1 and causing the differential amplifier A2 to be ON or OFF.

The oscillation circuit 1a according to the present embodiment is configured to switch from a first mode in which the differential amplifier circuit A2 is actively operated to a second mode in which the differential amplifier circuit A2 is OFF by switching the switch SW1 and causing the differential amplifier circuit A2 to be ON or OFF with a control signal output by the oscillation amplitude detection circuit 4 on the basis of the oscillation amplitude of the oscillation signal Vo of the oscillation circuit 1a. Here, the switching condition of the time when the oscillation amplitude of the oscillation circuit 1a reaches 70-95% of the final convergence amplitude is merely an example. For the oscillation amplitude detection circuit 4, the switching condition can be appropriately determined according to various conditions in the electronic device to be applied or the like.

Figure 9:
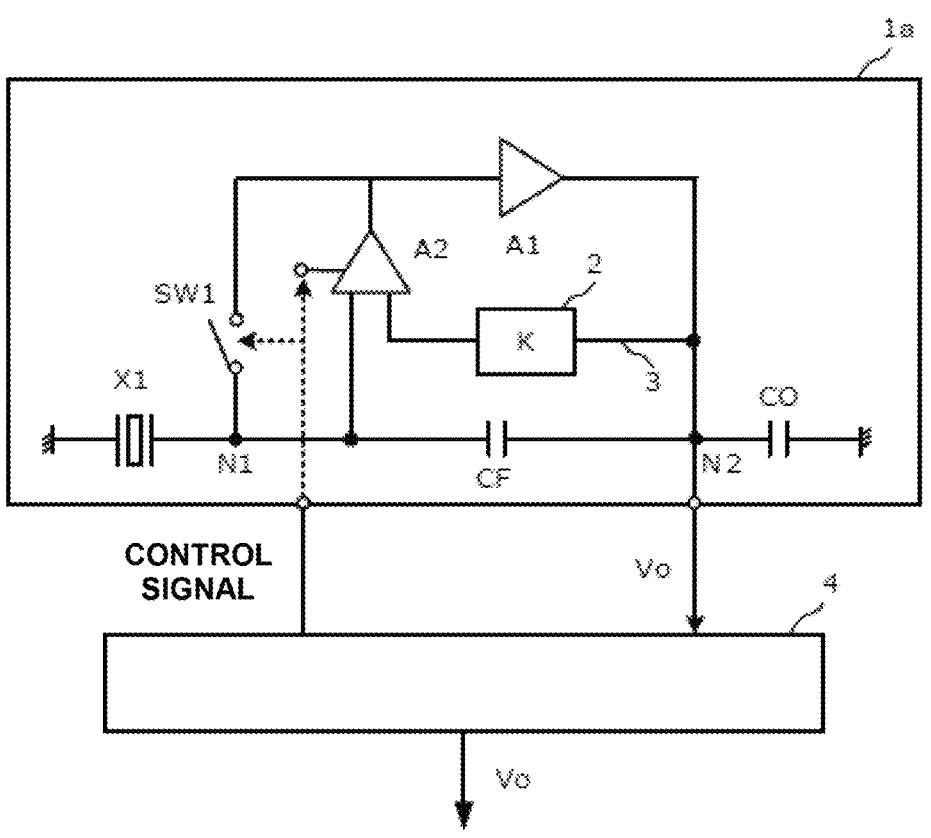
FIG. 9 shows a modification example of the oscillation circuit according to the second embodiment of the present invention.

The configuration of the switch SW1 for switching from the first mode in which the differential amplifier circuit A2 is actively operated to the second mode in which the differential amplifier circuit is OFF is not limited to that illustrated in FIGS. 7 and 9.

Figure 10:
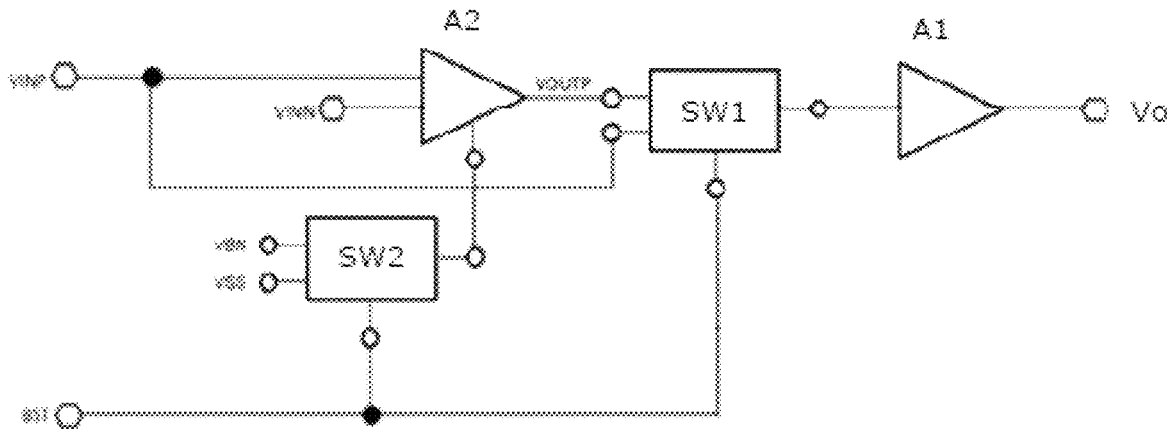
FIG. 10 shows a configuration example of a switch in the oscillation circuit according to the second embodiment of the present invention.

FIG. 10 shows a specific configuration example of a switch in the oscillation circuit 1a according to the present embodiment. In the configuration example shown in FIG. 10, the switch SW1 is a switch for switching signals input to the amplifier circuit A1, which is a complementary source follower. The switch SW1 is configured to connect the output terminal of the differential amplifier circuit A2 and the input terminal of the amplifier circuit A1 when the control signal is "High", while the switch SW1 is configured to connect the first input terminal VINP of the differential amplifier circuit A2 and the input terminal of the amplifier circuit A1 when the control signal is "Low".

The switch SW2 shown in FIG. 10 is a switch that controls the ON and OFF of the differential amplifier A2. The output of the switch SW2 is connected to the current source control terminal of the differential amplifier circuit A2. The switch SW2 is configured to select a bias VBN sufficient to cause the differential amplifier circuit A2 to be actively operated when the control signal is "High", and the switch SW2 is configured to select a bias VSS that causes the differential amplifier circuit A2 to be OFF when the control signal is "Low".

The oscillation circuit utilized in the present embodiment is basically a source-follower-based Colpitts oscillation circuit at the time of both the oscillation start-up and the steady-state oscillation. The source-follower-based Colpitts oscillation circuit is characterized by its low current consumption setting and low noise.

In the oscillation circuit 1*a* according to the present embodiment, the differential amplifier circuit A2 is actively operated to increase the negative resistance at the time of oscillation start-up, thereby shortening the oscillation start-up time and enabling high-frequency oscillation. Meanwhile, the current consumption is relatively low at the time of steady-state oscillation by causing the differential amplifier circuit A2 to be not actively operated and causing the negative resistance value to be relatively reduced to have only an amount enough to maintain steady-state oscillation. This makes it possible to make use of the characteristics of the source-follower-based Colpitts oscillation circuit to facilitate fast start-up and high-frequency oscillation.

At the time of oscillation start-up, the current consumption increases as much as the differential amplifier circuit is actively operated compared to the time of steady-state oscillation. However, the advantageous effect of shortening the start-up time allows reducing power consumption as in the oscillation circuit shown in FIG. 12.

As described above, it is possible to achieve an oscillation circuit that facilitates high-speed start-up and high-frequency oscillation in accordance with the present embodiment. By applying the oscillation circuit of the present embodiment to electronic devices such as mobile phones or IoT devices, it is possible to lower the power consumption of those electronic devices.

Embodiments of the present invention have been described above. However, the present invention is not limited to the above-described embodiments. Various modifications that can be understood by a person skilled in the art can be made to the configurations and details of the present invention within the scope of the present invention.

Appendices

The following appendices will be disclosed now with respect to the above-described embodiments.

Appendix 1

An oscillation circuit comprising:

an oscillator;

a first capacitance having one end connected to the oscillator;

a second capacitance having one end connected to the other end of the first capacitance;

an output terminal connected to a node between the first capacitance and the second capacitance;

an amplifier circuit connected between a node between the oscillator and the first capacitance and a node between the first capacitance and the second capacitance to form an oscillation loop together with the first capacitance;

a differential amplifier circuit arranged on the oscillation loop; and a feedback path configured to feed a part of an output on the output terminal back to the differential amplifier circuit.

Appendix 2

The oscillation circuit according to Appendix 1, further comprising a feedback amount adjusting circuit provided on the feedback path and configured to adjust a feedback amount fed back to the differential amplifier.

Appendix 3

The oscillation circuit according to Appendix 1, wherein the differential amplifier circuit comprises a first input terminal, a second input terminal, and a differential output terminal, the first input terminal of the differential amplifier circuit is connected to a node between the oscillator and the first capacitance, the second input terminal of the differential amplifier circuit is connected to the feedback path, and the differential output terminal of the differential amplifier circuit is connected to an input terminal of the amplifier circuit.

Appendix 4

The oscillation circuit according to Appendix 1 configured to be operated in a first mode of oscillation operation in which the differential amplifier circuit is actively operated at oscillation start-up, and a second mode of oscillation operation in which the differential amplifier circuit is not actively operated at steady-state oscillation.

Appendix 5

The oscillation circuit according to Appendix 4, further comprising a switch for selectively connecting the first input terminal and the differential output terminal of the differential amplifier connected to the oscillation loop.

Appendix 6

The oscillation circuit according to Appendix 4, further comprising a detection circuit for detecting oscillation amplitude of the oscillation circuit, wherein the detection circuit is configured to cause switching from the first mode to the second mode when the oscillation amplitude at the time of oscillation start-up reaches 70-95% of final convergence amplitude.

Appendix 7

The oscillation circuit according to any one of Appendices 1-6, wherein the amplifier circuit is a complementary source follower.

Appendix 8

An electronic device comprising the oscillation circuit according to any one of Appendices 1-7.

INDUSTRIAL APPLICABILITY

The present invention can be applied to oscillation circuits used in small electronic devices.

REFERENCE SIGNS LIST

1: oscillation circuit; 2: feedback amount adjusting circuit; 3: feedback path; A1: amplifier circuit; A2: differential amplifier circuit; X1: oscillator; CF, CO: oscillation capacitance

The invention claimed is:

1. An oscillation circuit comprising:

an oscillator;

a first capacitance having one end connected to the oscillator;

a second capacitance having one end connected to the other end of the first capacitance;

an output terminal connected to a node between the first capacitance and the second capacitance;

an amplifier circuit connected between a node between the oscillator and the first capacitance and a node between the first capacitance and the second capacitance to form an oscillation loop together with the first capacitance;

a differential amplifier circuit arranged on the oscillation loop; and a feedback path configured to feed a part of an output on the output terminal back to the differential amplifier circuit.

2. The oscillation circuit according to claim 1, further comprising a feedback amount adjusting circuit provided on the feedback path and configured to adjust a feedback amount fed back to the differential amplifier.

3. The oscillation circuit according to claim 1, wherein the differential amplifier circuit comprises a first input terminal, a second input terminal, and a differential output terminal, the first input terminal of the differential amplifier circuit is connected to a node between the oscillator and the first capacitance, the second input terminal of the differential amplifier circuit is connected to the feedback path, and the differential output terminal of the differential amplifier circuit is connected to an input terminal of the amplifier circuit.

4. The oscillation circuit according to claim 1 configured to be operated in a first mode of oscillation operation in which the differential amplifier circuit is actively operated at oscillation start-up, and a second mode of oscillation operation in which the differential amplifier circuit is not actively operated at steady-state oscillation.

5. The oscillation circuit according to claim 4, further comprising a switch for selectively connecting the first input terminal and the differential output terminal of the differential amplifier connected to the oscillation loop.

6. The oscillation circuit according to claim 4, further comprising a detection circuit for detecting oscillation amplitude of the oscillation circuit, wherein the detection circuit is configured to cause switching from the first mode to the second mode when the oscillation amplitude at the time of oscillation start-up reaches 70-95% of final convergence amplitude.

7. The oscillation circuit according to claim 1, wherein the amplifier circuit is a complementary source follower.

8. An electronic device comprising the oscillation circuit according to claim 1.

* * * * *